US009513552B2

(12) United States Patent
Yoo et al.

(10) Patent No.: US 9,513,552 B2
(45) Date of Patent: Dec. 6, 2016

(54) MULTIPLE-PATTERNING PHOTOLITHOGRAPHIC MASK AND METHOD

(71) Applicant: Taiwan Semiconductor Manufacturing Company, Ltd., Hsin-Chu (TW)

(72) Inventors: Chue San Yoo, Hsin-Chu (TW); Chang-Jyh Hsieh, Hsin-Chu (TW); Li-Wei Kung, Chong-Her (TW); Yung-Cheng Chen, Jhubei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 73 days.

(21) Appl. No.: 14/665,961

(22) Filed: Mar. 23, 2015

(65) Prior Publication Data

US 2015/0198887 A1    Jul. 16, 2015

Related U.S. Application Data

(63) Continuation of application No. 13/721,596, filed on Dec. 20, 2012, now Pat. No. 8,986,911.

(51) Int. Cl.
*G03F 7/20* (2006.01)
*H01L 21/027* (2006.01)

(52) U.S. Cl.
CPC .............. *G03F 7/2022* (2013.01); *G03F 7/20* (2013.01); *G03F 7/70466* (2013.01); *G03F 7/70475* (2013.01); *H01L 21/0274* (2013.01)

(58) Field of Classification Search
CPC ...... G03F 7/20; G03F 7/2022; G03F 7/70466; G03F 7/70475; H01L 21/0274
USPC ........................................ 430/5, 22, 30, 394
See application file for complete search history.

(56) References Cited

U.S. PATENT DOCUMENTS

| | | | |
|---|---|---|---|
| 6,511,791 | B1 | 1/2003 | Bukofsky et al. |
| 7,723,170 | B2 | 5/2010 | Lim |
| 8,133,661 | B2 | 3/2012 | Chang et al. |
| 2004/0076889 | A1 | 4/2004 | Huang et al. |

*Primary Examiner* — Christopher Young
(74) *Attorney, Agent, or Firm* — Haynes and Boone, LLP

(57) ABSTRACT

A composite mask suitable for multiple-patterning lithographic processes and a multiple-patterning photolithographic process utilizing the mask are disclosed. An exemplary embodiment includes receiving a mask having a plurality of sub-reticles and a substrate having one or more regions. A first sub-reticle of the plurality of sub-reticles is aligned with a first region of the one or more regions. A movement pattern is designated relative to the substrate. A first photolithographic process is performed including exposing the substrate using the mask to form a first exposed area on the substrate. An alignment of the mask relative to the substrate is shifted according to a first direction determined by the movement pattern. A second photolithographic process is performed including exposing the substrate using the mask to form a second exposed area on the substrate such that the second exposed area overlaps the first.

20 Claims, 19 Drawing Sheets

MULTIPLE-PATTERNING PHOTOLITHOGRAPHIC MASK AND METHOD

CROSS-REFERENCE TO RELATED APPLICATIONS

The present application is a continuation of U.S. application Ser. No. 13/721,596, filed Dec. 20, 2012, to Chue San Yoo, et al., entitled "MULTIPLE-PATTERNING PHOTOLITHOGRAPHIC MASK AND METHOD", which is incorporated herein by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed. For example, photolithographic limitations have made forming accurate features increasingly difficult as device size decreases. Although existing lithographic techniques have been generally adequate, they have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
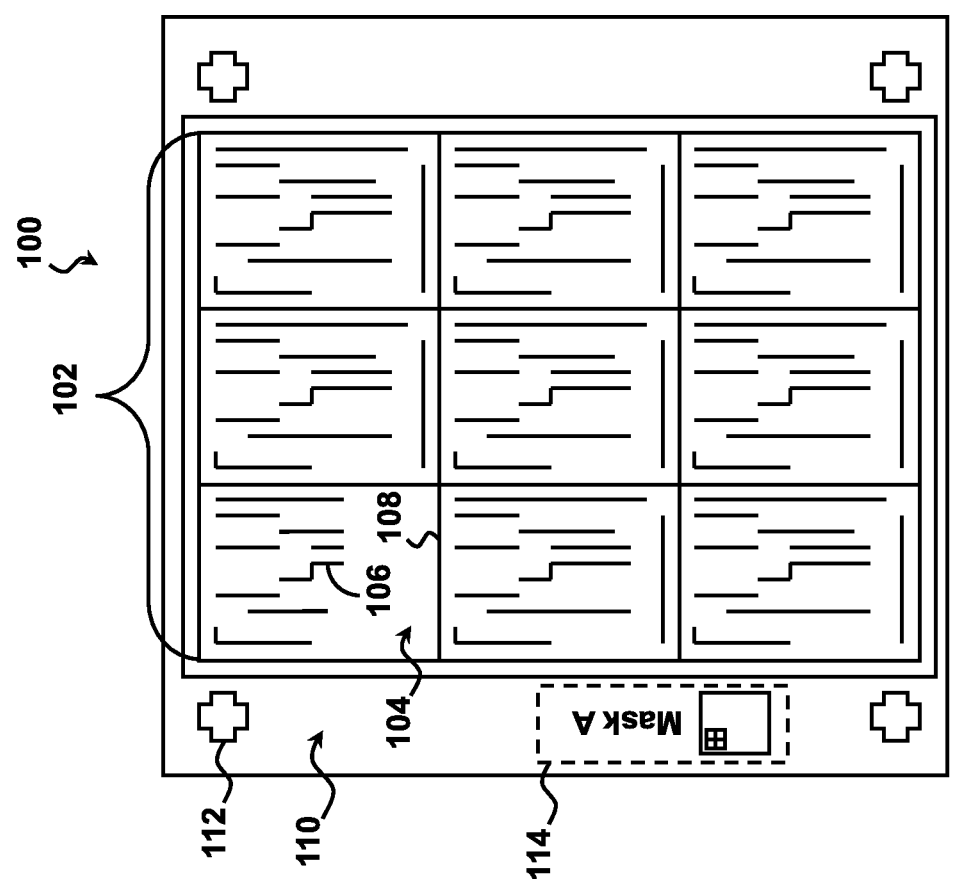
FIG. 1 is a diagrammatic illustration of a single exposure mask for IC manufacturing according to some embodiments.

The present disclosure relates generally to IC device manufacturing and more particularly, to multiple-patterning photolithographic masks and to multiple-patterning photolithography.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a diagrammatic illustration of a single exposure mask 100 for IC manufacturing according to some embodiments. The mask 100 may include a mask substrate, an absorption layer, one or more attenuating layers, and/or one or more reflective layers. Suitable mask substrate materials include fused silica, fused quartz, calcium fluoride ($CaF_2$), and/or other suitable material. The absorption layer may include chromium (CR), MoSi, and/or other suitable materials. The absorption layer may be shaped using a mask writing technique such as electron beam writing, ion beam writing, photolithography such as binary photolithography or phase shift photolithography coupled with etching such as wet or dry etching, and can be shaped using an alternative mask writing technique. The mask 100 may include attenuating layers formed from such materials as metal silicide, metal nitride, iron oxide, inorganic material and/or other suitable materials. The mask 100 may also include one or more reflective layers. These reflective layers may be created using materials such as silicon/molybdenum, molybdenum/beryllium, and/or other suitable materials. The mask 100 contains a reticle 102, which contains one or more dies 104 containing device features 106. The device features 106 of each die 104 are used to form an integrated circuit chip. The reticle 102 may also include scribe lines 108, sacrificial areas intended to be used when dicing the wafer. The mask 100 includes a frame area 110 around the reticle 102, which contains the fiducial features, markings that are not part of an integrated circuit but are nonetheless a part of IC production. These fiducial features can include alignment marks 112 and a mask identifier 114 along with other features such as logos and text.

Photolithography is used to transfer mask patterns, such as those of mask 100 to a wafer or substrate. Each photolithographic mask in a set has a pattern formed by transmissive or reflective regions. During photolithography, radiation such as ultra-violet (UV) light, deep ultra-violet (DUV) light, extreme ultra-violet (EUV) light, or an e-beam passes through or reflects off the mask 100 and strikes a photoresist coating on the semiconductor substrate. The photoresist is selectively removed to reveal a pattern that is used to create the circuit features on the substrate.

The size of the reticle 102 may have a considerable impact on the number of exposures used to fully expose a wafer or substrate. This, in turn, may affect the number of wafers per hour (WPH) the photolithographic system can produce. Accordingly, while the trend towards increased wafer size (e.g., from 200 mm to 300 mm, from 300 mm to 450 mm, and so on) may increase the throughput of other process steps, the increased area to be exposed may adversely affect the WPH of photolithography. One technique to decrease the number of exposures and thereby improve the throughput of the photolithography system is to employ a larger mask 100 with a correspondingly larger reticle 102. For example, in some embodiments, a 9-inch mask is used as an alternative for a 6-inch mask. Other embodiments utilize a 12-inch or larger mask. Increasing mask size has been shown to increase WPH of a photolithographic system for both single-exposure and multiple-exposure lithographic processes.

As the name implies, in a single-exposure process, the photoresist is developed after a single exposure using a single mask 100. However, in some photolithographic environments, better results can be obtained by dividing device features 106 between two or more masks 100. A single photoresist coating may then be exposed with each of the masks before being developed. Alternately, multiple iterations of coating, exposing, developing, and processing may be used for a single process step.

Despite the additional complexity, multiple-patterning processes may present advantages that outweigh the simplicity and economy of single exposure. For example, multiple exposures may deliver a smaller minimum feature size, may reduce feature spacing, may improve transitions between exposed and unexposed areas, may produce more physically stable masks, may increase circuit reliability and yield, as well as other benefits. As these advantages are exemplary, no particular advantage is necessarily characteristic of any particular embodiment. These advantages must be weighed against potential increased cost including the cost of producing additional masks, and potential increased exposure time including additional exposure time, alignment time, and mask loading and unloading time. The potential also exists to introduce overlay problems that may result in defective devices and lower yield. Some embodiments of this disclosure reduce the drawbacks associated with multiple-patterning processes while retaining the advantages.

Figure 2:
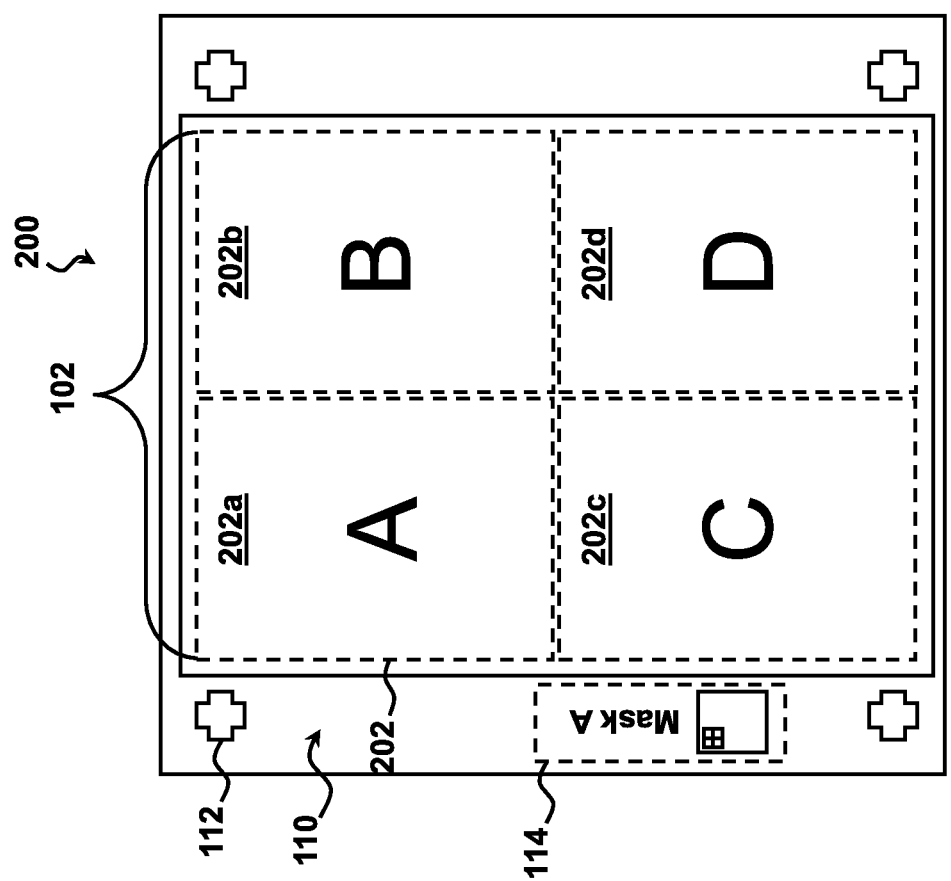
FIG. 2 is a diagrammatic illustration of a composite multiple-patterning mask for IC manufacturing according to some embodiments.

FIG. 2 is a diagrammatic illustration of a composite multiple-patterning mask 200 for IC manufacturing according to some embodiments. The materials (including mask substrate materials, absorption layer materials, attenuating layer materials, and reflective layer materials) and features (including the reticle 102, one or more dies 104, device features 106, scribe lines 108, frame area 110, alignment marks 112, and the mask identifier 114) of the multiple-patterning mask 200 may be substantially similar to those of the single-exposure mask 100. The multiple-patterning mask 200 contains a reticle 102 divided into two or more sub-reticles 202 (e.g., sub-reticle 202a, 202b, 202c, and 202d). In various non-limiting embodiments, the mask 200 includes 2, 3, 4, 8, or 16 sub-reticles 202. Other numbers of sub-reticles 202 are contemplated and provided for. In the illustrated embodiment, the reticle 102 includes a 2×2 configuration of sub-reticles 202. Other exemplary configurations include, and are not limited to, 1×2, 1×4, and 4×4.

Each sub-reticle 202 contains a set of device features. For clarity, the device features within the sub-reticles 202 are not illustrated individually. Instead, in the illustrated embodiment, the subsets of device features are identified as subset A, subset B, subset C, and subset D and correspond to sub-reticles 202a, 202b, 202c, and 202d respectively. In many embodiments, the device features are different between the different sub-reticles. Sub-reticles 202 may be grouped according to the associated exposure process. For example, in an embodiment, sub-reticles 202a, 202b, 202c, and 202d contain features to be used in the same multiple-patterning lithographic process to prepare a substrate for a particular manufacturing process, and therefore the sub-reticles may be grouped together. However, the reticle 102 may also contain sub-reticles associated with other manufacturing processes. In an embodiment, sub-reticles 202a and 202b contain features for a first multiple-patterning lithographic process, sub-reticle 202c contains features for a second lithographic process unrelated to the first multiple-patterning process, and sub-reticle 202d contains features for a third lithographic process unrelated to the first or the second. In another embodiment, sub-reticle 202d contains features for a lithographic exposure to be performed on a different substrate than that used for sub-reticles 202a, 202b, and 202c.

The use of a composite multiple-patterning mask 200 has the potential to provide several advantages in a multiple-patterning methodology including improved overlay control and reduced costs. As an example of improved overlay control, in some embodiments, potential overlay issues relating to inter-mask variations are avoided through the use of a composite multiple-patterning mask 200. In more detail, when more than one mask is used in a multiple-exposure process, there is the potential for the features of each mask to be slightly offset or distorted relative to one another. This may result in overlay issues, some of which can affect yield. Since the composite multiple-patterning mask 200 is a single mask, in some embodiments, inter-mask variations are not an issue.

As an example of cost reduction, the sub-reticle 202 structure may allow the composite mask 200 to substitute for multiple individual masks. Accordingly, in some embodiments, a single composite mask 200 is as a substitute for four individual masks. Even in embodiments where a multiple-patterning mask is more expensive to manufacture than a single exposure mask, the ability to replace multiple single-exposure masks may make the composite mask 200 less costly overall. Reducing the number of masks may also reduce mask verification, mask repair, mask storage, and mask maintenance costs.

Use of a composite mask 200 may also improve yield. In some embodiments, a multiple-patterning mask 200 eliminates inter-mask deviations present in equivalent mask sets. While mask making is a remarkably precise process, mask deviations and defects still occur. Deviation such as mask warping can cause mask alignment and overlay errors between the masks of a mask set. This may result in necking, bridging, and other yield-affecting errors. It follows that using a single composite mask 200 instead of a set of masks may reduce errors caused by inter-mask deviations. In such embodiments, this may reduce alignment time during photolithography, improve resolution and feature quality, improve yield, and/or provide other benefits.

A composite mask 200 may also reduce photolithography time and improve yield by reducing the number of mask loads and unloads. It takes time to swap masks in and out of a photolithography system. Furthermore, despite the care and precautions taken, mask swapping has the potential to introduce contaminants into the photolithography system. Thus, the composite mask 200 may have further potential to improve yield. Of course, no particular benefit is necessarily characteristic of any particular embodiment.

Figure 3:
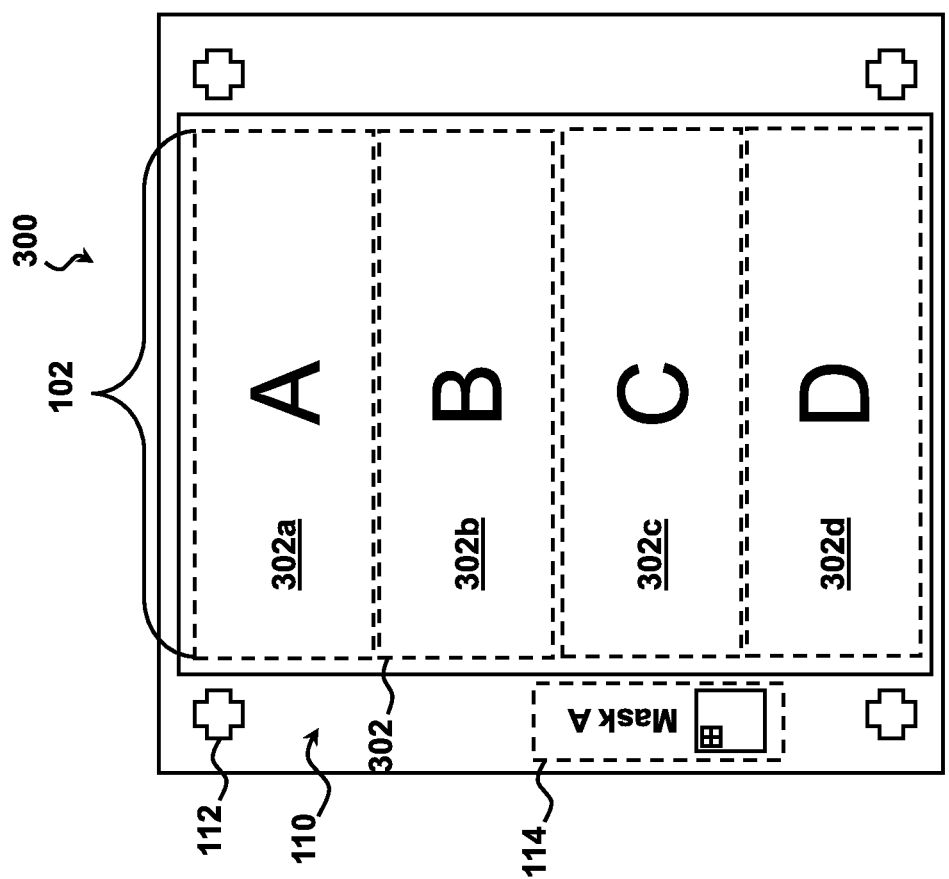
FIG. 3 is a diagrammatic illustration of a composite multiple-patterning mask for IC manufacturing according to some embodiments.

FIG. 3 is a diagrammatic illustration of a composite multiple-patterning mask 300 for IC manufacturing according to some embodiments. Except as noted, the multiple-patterning mask 300 is substantially similar to the multiple-patterning mask 300. Mask 300 contains an alternate arrangement of sub-reticles 302 (e.g., 302a, 302b, 302c, and 302d) in a 1×4 configuration. Other numbers and arrangements of sub-reticles 302 are contemplated and provided for. For example, in various non-limiting embodiments, the mask 300 includes 2, 3, 4, 8, or 16 sub-reticles 302.

Each sub-reticle 302 contains a set of device features. For clarity, the device features within the sub-reticles 302 are not illustrated individually. Instead, in the illustrated embodiment, the subsets of device features are identified as subset A, subset B, subset C, and subset D and correspond to sub-reticles 302a, 302b, 302c, and 302d respectively. In some embodiments, particular sub-reticles 302 of the mask 302 are to be used in the same multiple-patterning lithographic process on a single device layer and therefore are grouped together. In some embodiments, particular sub-reticles 302 are to be used in the same multiple-patterning lithographic process as sub-reticles of another mask and therefore are grouped together with the sub-reticles of the other mask. In some embodiments, particular sub-reticles 302 are to be used to expose a different substrate than other sub-reticles 302 within the mask 300. For example, some sub-reticles (e.g., sub-reticle 302a, 302b, and 302c) may correspond to a different semiconductor product than other sub-reticles (e.g., sub-reticle 302d).

Figure 4:
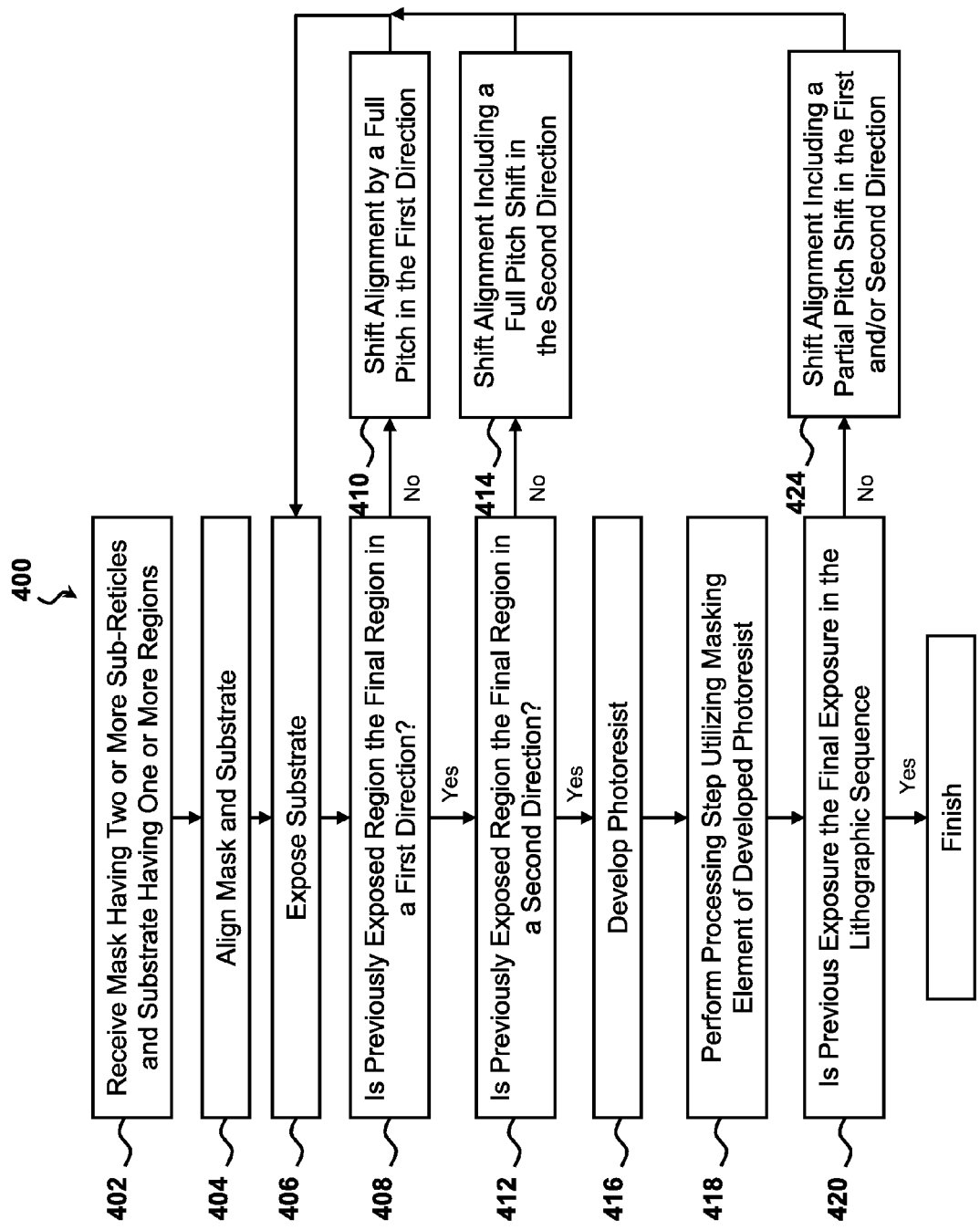
FIG. 4 is a flow diagram of a multiple-patterning multiple-etching method for manufacturing an IC device according to some embodiments.

A method 400 for manufacturing an IC device is described with reference made to FIGS. 4-10. FIG. 4 is a flow diagram of the multiple-patterning multiple-etching method 400 for manufacturing an IC device according to some embodiments. It is understood that additional steps can be provided before, during, and after the method 400, and some of the steps described can be replaced or eliminated for other embodiments of the method 400. FIGS. 5-10 are annotated illustrations of a substrate 500 undergoing a method of manufacturing an IC device according to some embodiments. FIGS. 5-10 have been annotated and simplified to better convey the concepts of the present disclosure.

The method 400 begins at block 402 where a composite mask 200 having two or more sub-reticles 202 is received. Referring to block 402 and FIG. 5, a substrate 500 having one or more active device regions 502 (e.g., regions 502a and 502b) is also received. The substrate 500 may be a wafer, a semiconductor substrate, or any base material on which processing is conducted to produce layers of material, pattern features, and/or integrated circuits. The substrate 500 may be a bulk silicon substrate. Alternatively, the substrate 500 may comprise an elementary semiconductor, such as silicon or germanium in a crystalline structure; a compound semiconductor, such as silicon germanium, silicon carbide, gallium arsenic, gallium phosphide, indium phosphide, indium arsenide, indium antimonide, and/or combinations thereof. Possible substrates 500 also include a silicon-on-insulator (SOI) substrate. SOI substrates are fabricated using separation by implantation of oxygen (SIMOX), wafer bonding, and/or other suitable methods. In some embodiments, a photosensitive material referred to as a photoresist layer is applied to the substrate 500.

The regions 502 of the substrate 500 correspond to areas of the substrate 500 to be patterned using the current mask, whereas excluded regions 504 correspond to areas of the substrate 500 where patterning is either not performed or will not be effective. For example, patterning will not be effective in excluded regions 504 where the shape of the wafer prevents the formation of a portion of the design. Excluded regions 504 may also be set aside for design purposes. For example, in some embodiments, excluded regions 504 will be reserved for forming test structures upon the substrate 500. Because the excluded regions 504 may be designated according to design purposes, excluded regions 504 for a particular reticle, sub-reticle, or mask may be active regions 502 for another reticle, sub-reticle, or mask.

Figure 5:
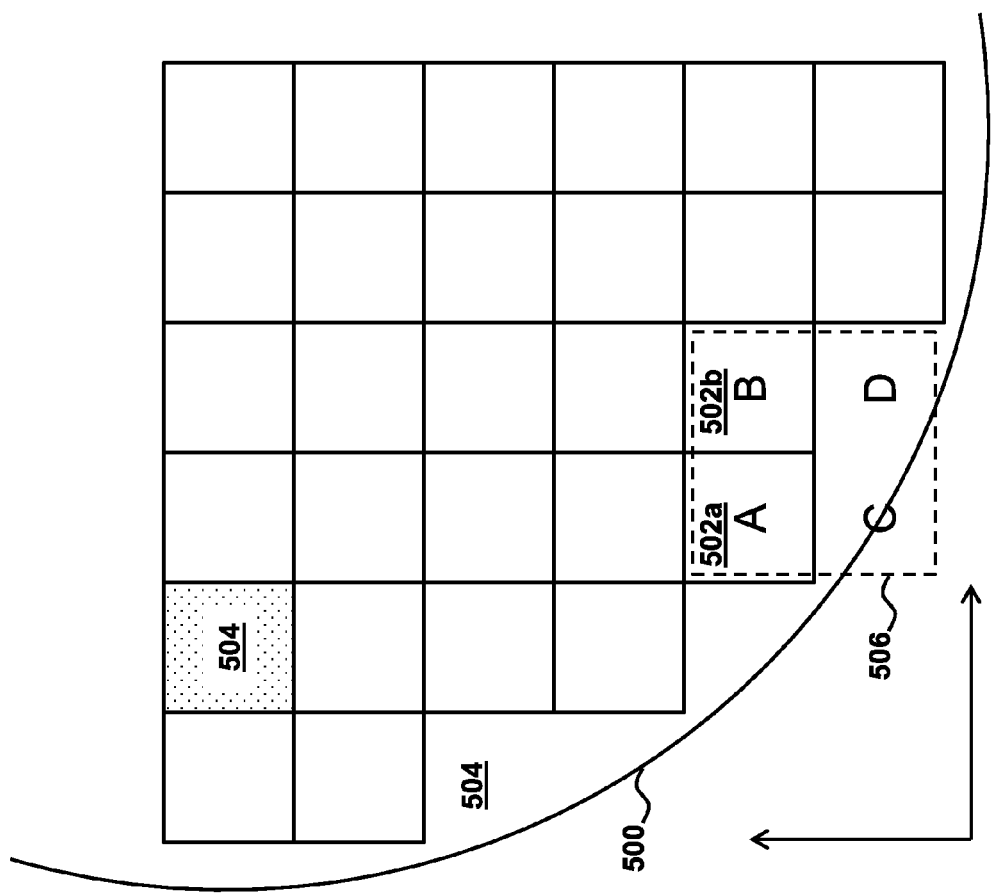
FIGS. 5-10 are annotated illustrations of a substrate undergoing a method of manufacturing an IC device according to some embodiments.

In block 404, the substrate 500 is aligned for a photolithographic process using the mask 200 in a first orientation. Commonly, the substrate 500 is mounted in a wafer stage of a photolithographic system, while the mask 200 is mounted in a mask stage. Thus, the alignment may be performed by moving the wafer stage, the mask stage, or both. In FIG. 5, the orientation of the mask reticle 102 relative to the substrate 500 is represented by box 506. In block 406, the substrate is exposed in a photolithographic process using the mask in the first orientation. In the exemplary orientation, the photolithographic process exposes region 502a using a first subset of device features. Referring to FIG. 5, individual device features are omitted for clarity. Instead, region 502a is annotated to represent exposure using feature subset A. Likewise, region 502b is annotated to represent exposure using feature subset B. In the illustrated embodiment, sub-reticles corresponding to feature subsets C and D align with excluded region 504. Therefore, the patterning using these subsets will not be effective.

Figure 6:
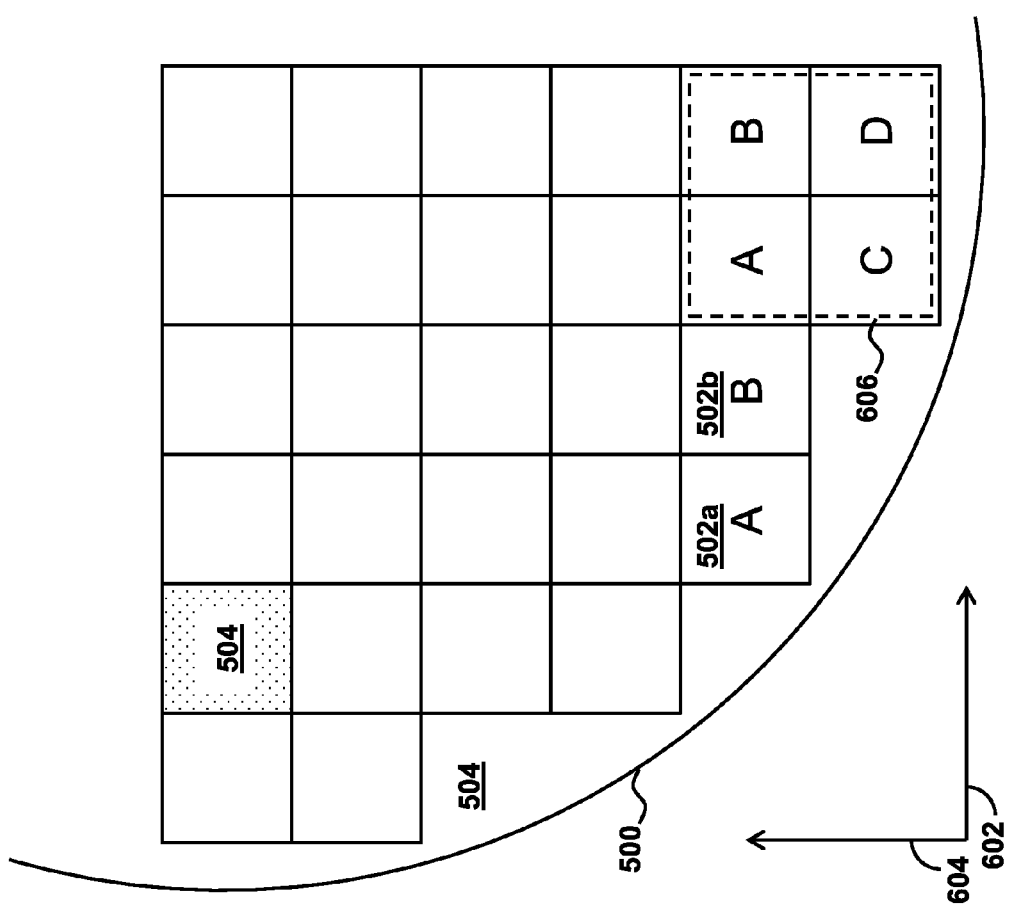

Referring to block 408 and FIG. 6, a first direction for movement is defined. This first direction 602 is illustrated and referred to as a horizontal direction for clarity, although it is understood that it may just as accurately be referred to as a vertical direction. A second direction 604 may also be defined, the second direction 604 being perpendicular to the first direction 602. The second direction is referred to as a vertical direction for clarity. In block 408, it is determined whether a previously exposed region 502 is the final region in the first direction 602. In the embodiment of FIG. 6, this final region 502 corresponds to the row end. If the mask 200 has not reached the row end, in block 410, the mask 200 and the substrate 500 are aligned in a second orientation indicated by box 606. This orientation represents a shift of a full pitch (approximately a full reticle accounting for inter-sub-reticle spacing, inter-regional spacing, alignment, and/or other factors) in the first direction. The shift may be achieved by moving the mask stage, the wafer stage, or both. In the illustrated embodiment, the magnitude of the movement is such that the exposed area of the subsequent second exposure does not overlap or superimpose the exposed area of the first exposure. The method proceeds to block 406, where the substrate 500 is exposed in a photolithographic process using the mask 200 in the second orientation.

The method of blocks 406 to 410 is repeated until the mask 200 reaches the row end as determined in block 408. The method proceeds to block 412 where it is determined whether an exposed region is the final region in the second direction 604. If not, in block 414, the mask 200 and the substrate 500 are aligned in an orientation representing a shift of a full pitch in the second direction 604 perpendicular to the first direction 602. In an embodiment, the magnitude of the movement is such that the exposed area of the subsequent exposure does not overlap or superimpose the exposed area of any previous exposure. The alignment may also include a shift parallel to the first direction 602 in order to align with the first region 502 of the new row. The method of blocks 406 to 414 repeats until an exposed region is the final region in both the first and the second direction.

Figure 7:
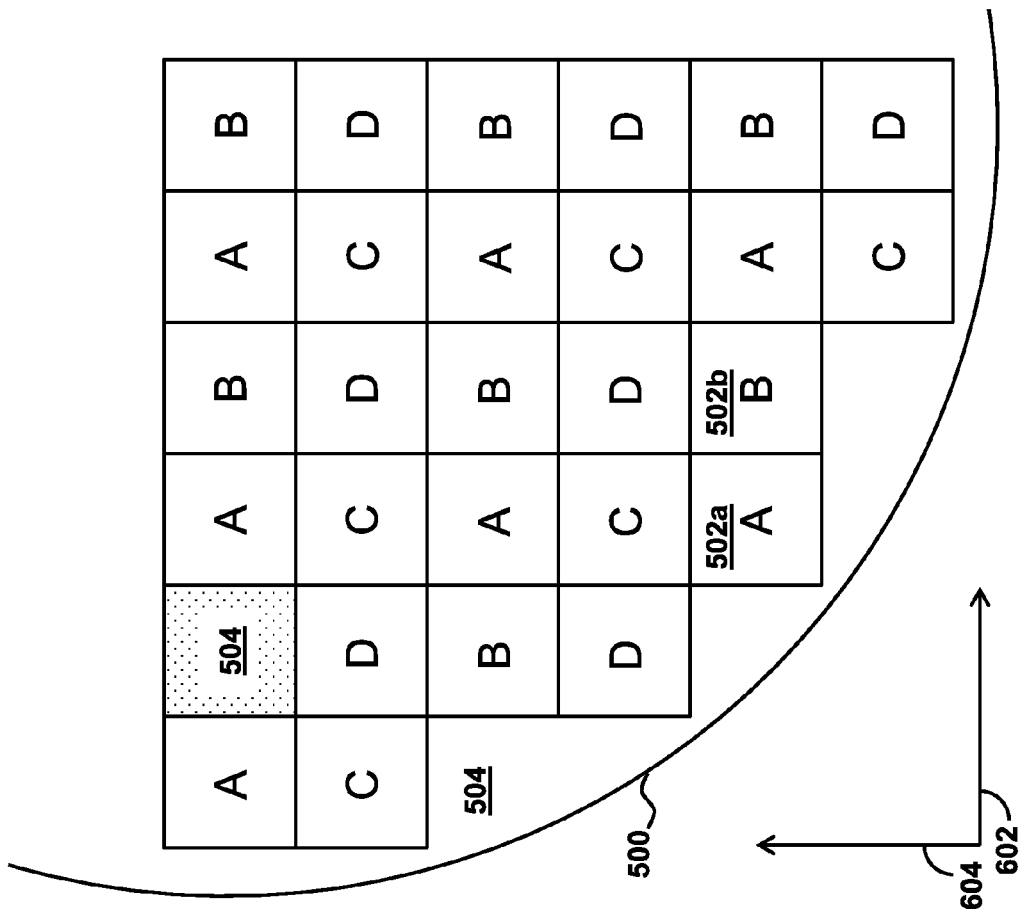
Figure 8:
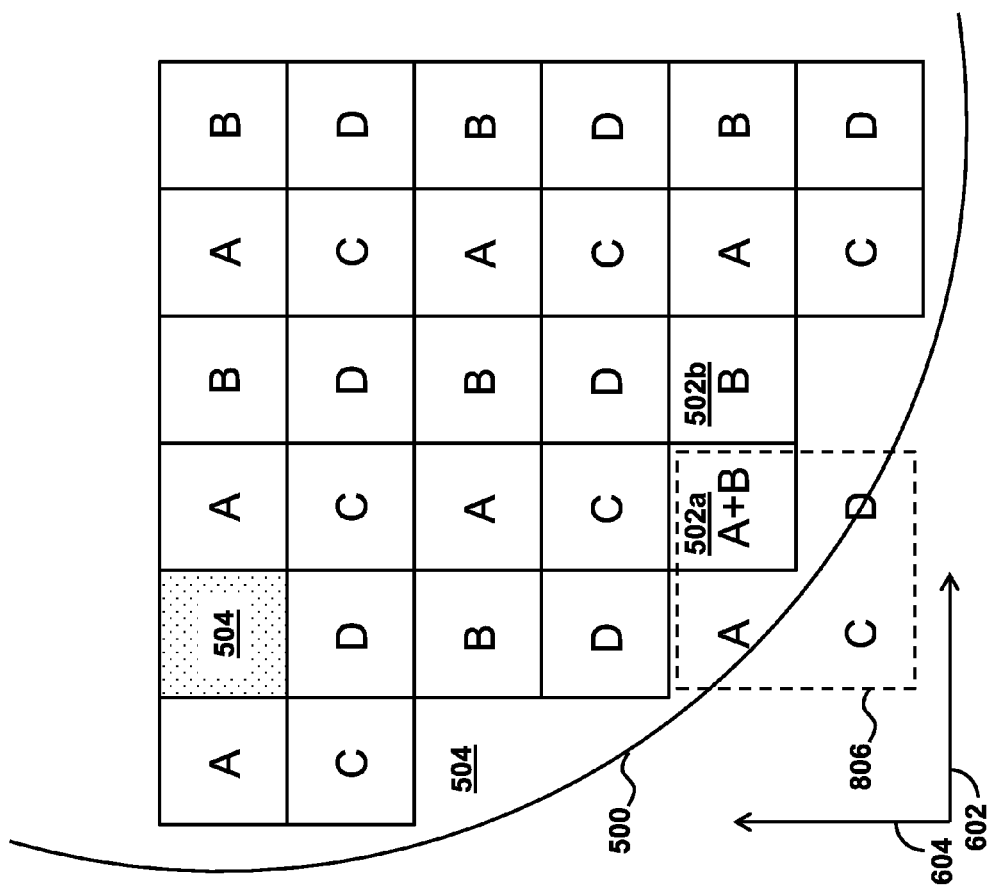

Referring to FIG. 7, in block 412, determining whether an exposed region is the final region in the second direction 604 may be the same as determining whether the mask 200 has been used to expose all the active regions 502 of the substrate 500. For clarity, the active regions 502 are annotated with letters corresponding to the features used to expose the active regions 502. As can be seen, for some excluded areas 504, a portion of the mask reticle 102 may be obscured to prevent exposure of the excluded area 504 by the obscured portion. This may be referred to as "blading off" the obscured sub-reticles 202.

Following the photolithographic process of blocks 406 to 414, the photoresist is developed in block 416. This may include performing a post-exposure bake process and developing the resist to form a masking element from a remaining portion of the resist. At this stage, active regions (e.g., active regions 502a and 502b) corresponding to equivalent designs may nevertheless have been exposed using different feature subsets (e.g., feature subsets A and B) produced by the different sub-reticles 202 of the mask 200. Therefore, in an embodiment, developing forms different masking element features within different regions. In block 418, the masking element is used in a processing step. Typical processing steps include etching such as dry etching and wet etching. However, some embodiments incorporate processing steps including deposition, implantation, epitaxy, and other suitable semiconductor manufacturing steps. Following the processing step, the remaining photoresist may be stripped from the substrate 500. In block 420, it is determined whether the previous exposure was the final exposure in the multiple-patterning lithographic process. In an exemplary multiple-patterning lithographic process having four iterations, the final exposure is the fourth exposure in the process.

Figure 9:
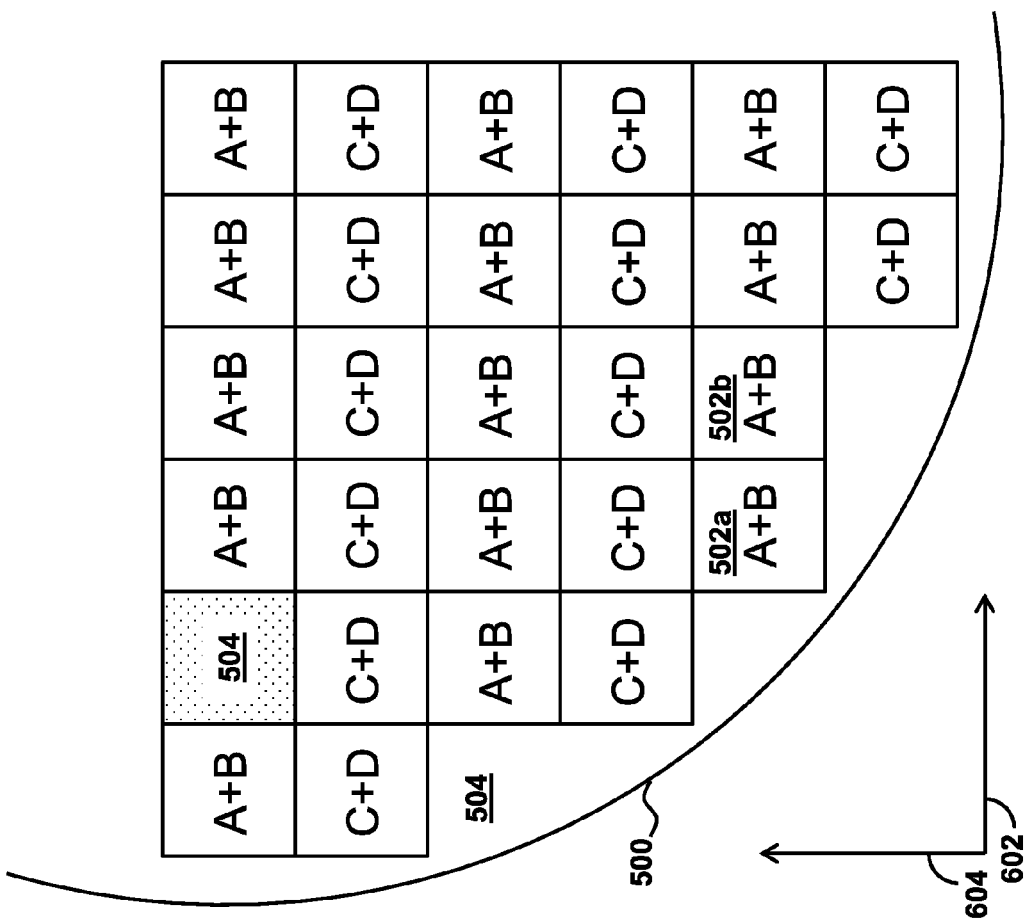
Figure 10:
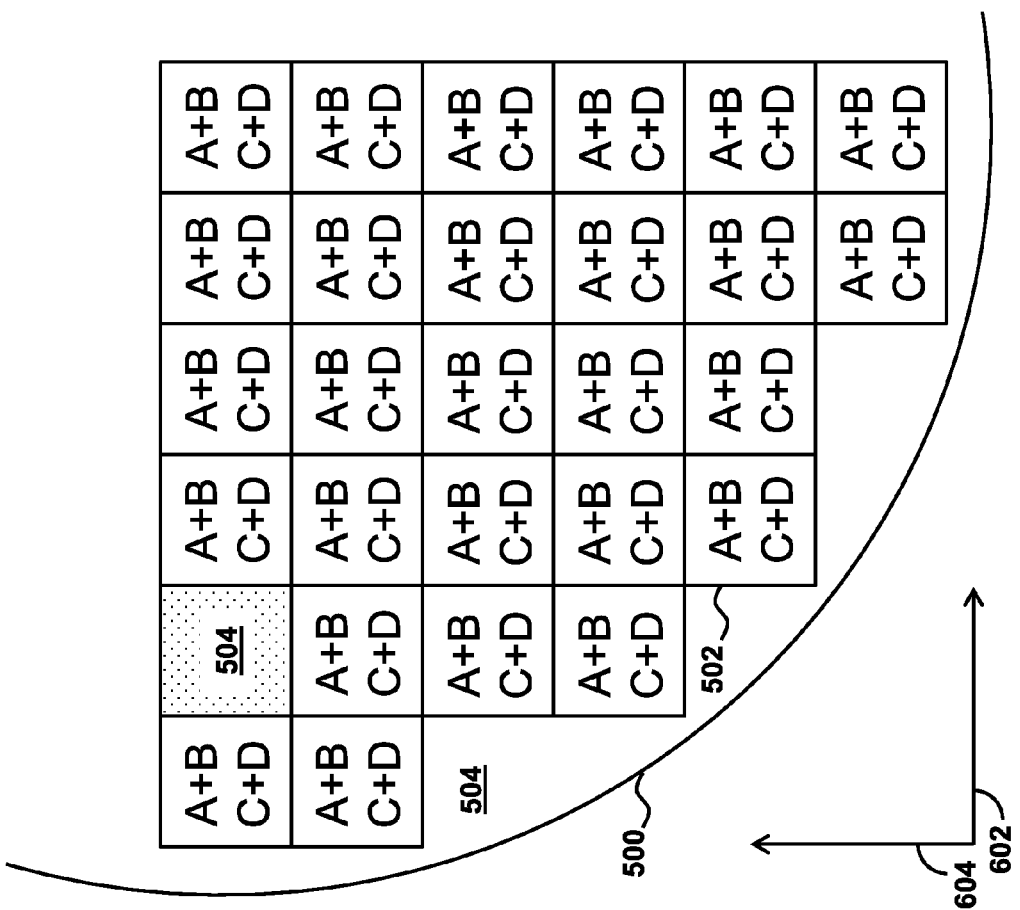

If the previous exposure was not the final exposure in the sequence, another photoresist coating is applied and the mask 200 and substrate 500 are realigned. Referring to block 424 and FIG. 8, the mask 200 and substrate 500 are realigned by an intermediate shift increment that includes an offset of less than a full pitch. The partial pitch shift may be determined by the configuration of the sub-reticles within the mask. For example, in an embodiment incorporating a mask 200 with a 2×2 configuration of sub-reticles, the partial pitch shift is a half pitch (approximately a half reticle accounting for inter-sub-reticle spacing, inter-regional spacing, alignment, and/or other factors) in the first direction. In a further embodiment incorporating a mask 200 with a 1×4 configuration of sub-reticles, the partial pitch shift is a quarter pitch (approximately a quarter reticle accounting for inter-sub-reticle spacing, inter-regional spacing, alignment, and/or other factors) in the first direction. In block 406, the substrate is exposed in this orientation. In the illustrated embodiment, region 502a is exposed with a second subset of features (subset B). Region 502 is annotated with "A+B" indicating the feature sets used in the current (subset B) and previous (subset A) exposures. The method of blocks 406 to 424 continues as before. FIG. 9 illustrates the status of the substrate 500 after the second photolithographic process. The method continues until it is determined in block 420 that the previous exposure was the final exposure in the multiple-patterning lithographic sequence. FIG. 10 illustrates the status of the substrate upon completion, where each region 502 has been exposed and processed using each subset of features (e.g., feature subsets A, B, C, and D).

Figure 11:
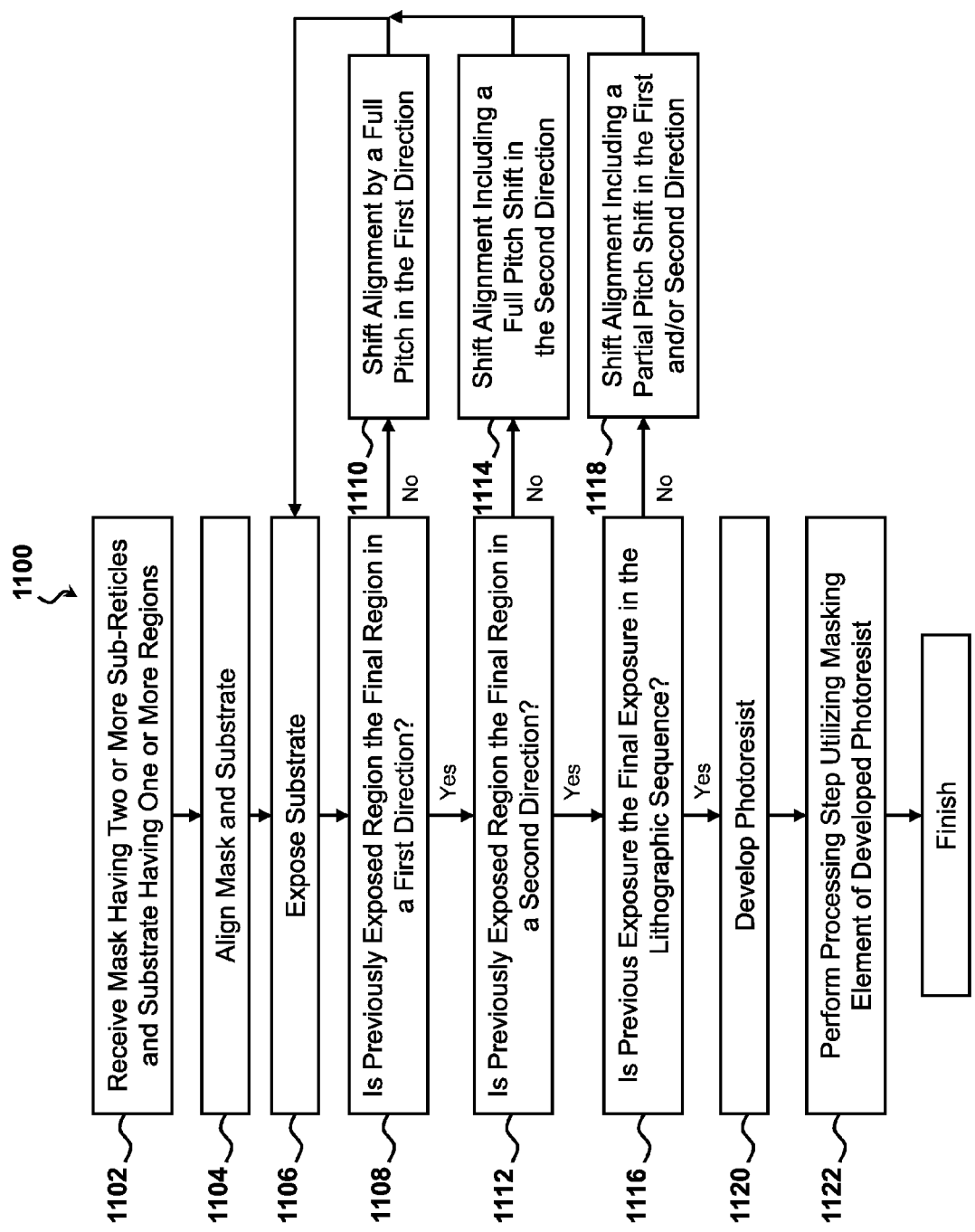
FIG. 11 is a flow diagram of a multiple-patterning single-etching method for manufacturing an IC device according to some embodiments.

FIG. 11 is a flow diagram of a multiple-patterning single-etching method 1100 for manufacturing an IC device according to some embodiments. It is understood that additional steps can be provided before, during, and after the method 1100, and some of the steps described can be replaced or eliminated for other embodiments of the method 1100. The method 1100 of FIG. 11 is substantially similar to method 400 of FIG. 4.

The method 1100 begins at block 1102 where a composite mask 200 having two or more sub-reticles 202 and a substrate 500 having one or more active device regions 502 are received. The substrate 500 may be a wafer, a semiconductor substrate, or any base material on which processing is conducted to produce layers of material, pattern features, and/or integrated circuits. In some embodiments, a photoresist layer is applied to the substrate 500.

In block 1104, the substrate 500 is aligned for a photolithographic process using the mask 200 in a first orientation. In block 1106, the substrate is exposed in a photolithographic process using the mask in the first orientation. In block 1108, it is determined whether a previously exposed region 502 is the final region in a first direction 602. In an embodiment, this final region 502 corresponds to the row end. If the mask 200 has not reached the row end, in block 1110, the mask 200 and the substrate 500 are aligned in a second orientation. This orientation represents a shift of a full pitch (approximately a full reticle accounting for inter-sub-reticle spacing, inter-regional spacing, alignment, and/or other factors) in the first direction. The shift may be achieved by moving the mask stage and/or the wafer stage. In some embodiments, the magnitude of the movement is such that the exposed area of the subsequent second exposure does not overlap or superimpose the exposed area of the first exposure. The method proceeds to block 1106, where the substrate 500 is exposed in a photolithographic process using the mask 200 in the second orientation.

The method of blocks 1106 to 1110 is repeated until the mask 200 reaches the row end as determined in block 1108. The method proceeds to block 1112 where it is determined whether an exposed region is the final region in a second direction 604 perpendicular to the first direction 602. If not, in block 1114, the mask 200 and the substrate 500 are aligned in an orientation representing a shift of a full pitch in the second direction 604. In an embodiment, the magnitude of the movement is such that the exposed area of the subsequent exposure does not overlap or superimpose the exposed area of any previous exposure. In block 1114, the alignment may also include a shift parallel to the first direction 602 in order to align with the first region 502 of the new row. The method of blocks 1106 to 1114 repeats until an exposed region is the final region in the second direction.

In block 1116, it is determined whether the previous exposure was the final exposure in the multiple-patterning lithographic process. In an exemplary multiple-patterning lithographic process having four iterations, the final exposure is the fourth exposure in the process. If the previous exposure was not the final exposure in the sequence, in block 1118, the mask 200 and substrate 500 are realigned by an intermediate shift increment that includes an offset of less than a full pitch. The partial pitch shift may be determined by the configuration of the sub-reticles within the mask. For example, in an embodiment incorporating a mask 200 with a 2×2 configuration of sub-reticles, the partial pitch shift is a half pitch (approximately a half reticle accounting for inter-sub-reticle spacing, inter-regional spacing, alignment, and/or other factors) in the first direction. In a further embodiment incorporating a mask 200 with a 1×4 configuration of sub-reticles, the partial pitch shift is a quarter pitch (approximately a quarter reticle accounting for inter-sub-reticle spacing, inter-regional spacing, alignment, and/or other factors) in the first direction. In block 1106, the substrate is exposed in this orientation. The method of blocks 1106 to 1118 continues as before.

Following the photolithographic process of blocks 1106 to 1118, the photoresist is developed in block 1120. This may include performing a post-exposure bake process and developing the resist to form a masking element from a remaining portion of the resist. In block 1122, the masking element is used in a processing step. Typical processing steps include etching such as dry etching, and wet etching. However, some embodiments incorporate processing steps including deposition, implantation, epitaxy, and other suitable semiconductor manufacturing steps. Following the processing step, the remaining photoresist may be stripped from the substrate 500.

Figure 12:
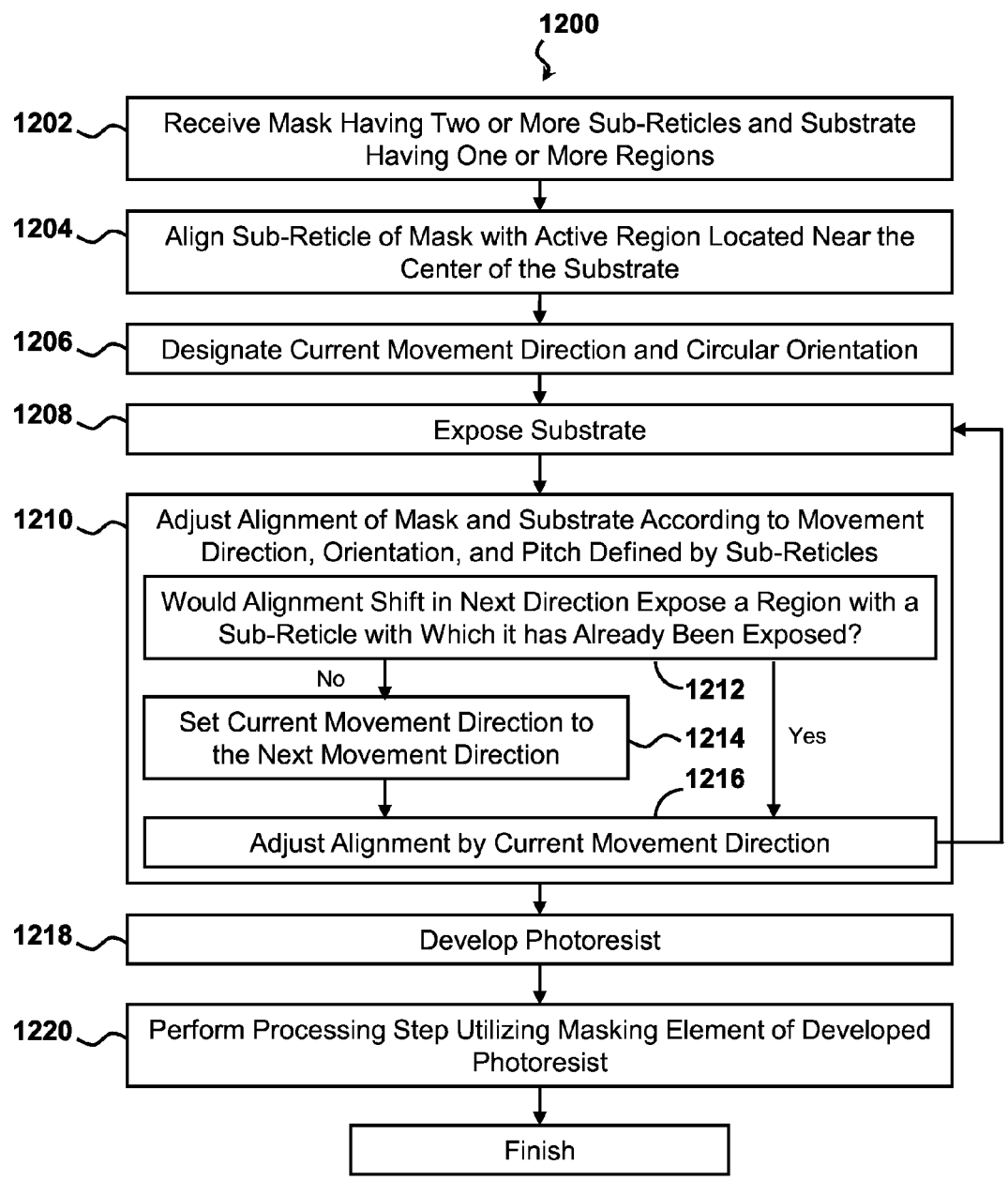
FIG. 12 is a flow diagram of a multiple-patterning single-etching method utilizing a spiral overlap pattern according to some embodiments.

A method 1200 for manufacturing an IC device is described with reference made to FIGS. 12-18. FIG. 12 is a flow diagram of the multiple-patterning single-etching method 1200 utilizing a spiral overlap pattern according to some embodiments. It is understood that additional steps can be provided before, during, and after the method 1200, and some of the steps described can be replaced or eliminated for other embodiments of the method 1200. FIGS. 13-18 are annotated illustrations of a substrate 500 undergoing the method 1200 of manufacturing an IC device according to some embodiments. FIGS. 13-18 have been annotated and simplified to better convey the concepts of the present disclosure.

The method 1200 begins at block 1202 where a composite mask 200 having two or more sub-reticles 202 is received. Referring to block 1202 and FIG. 13, a substrate 500 having one or more active device regions 502 (e.g., regions 502c and 502d) is also received. The substrate 500 may be a wafer, a semiconductor substrate, or any base material on which processing is conducted to produce layers of material, pattern features, and/or integrated circuits. In some embodiments, a photoresist layer is applied to the substrate 500. The substrate 500 may also include excluded regions 504 corresponding to areas of the substrate 500 where patterning is either not performed or will not be effective. For example, patterning will not be effective in excluded regions 504 where the shape of the wafer prevents the formation of a portion of the design. Excluded regions 504 may also be set aside for design purposes. Because the excluded regions 504 may be designated according to design purposes, excluded regions 504 for a particular reticle, sub-reticle, or mask may be active regions 502 for another reticle, sub-reticle, or mask.

Figure 13:
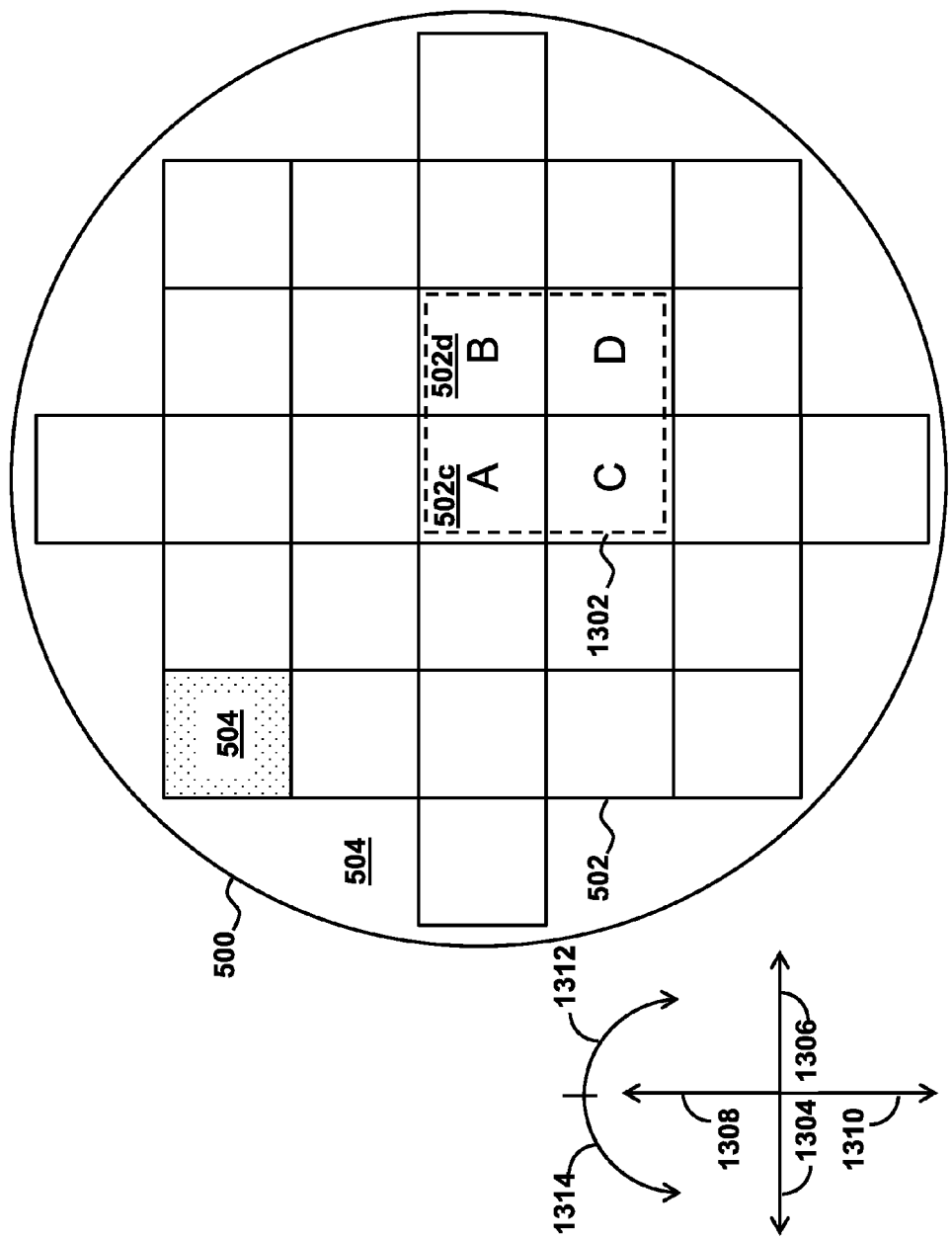
FIGS. 13-18 are annotated illustrations of a substrate undergoing a method of manufacturing an IC device according to some embodiments.
Figure 14:
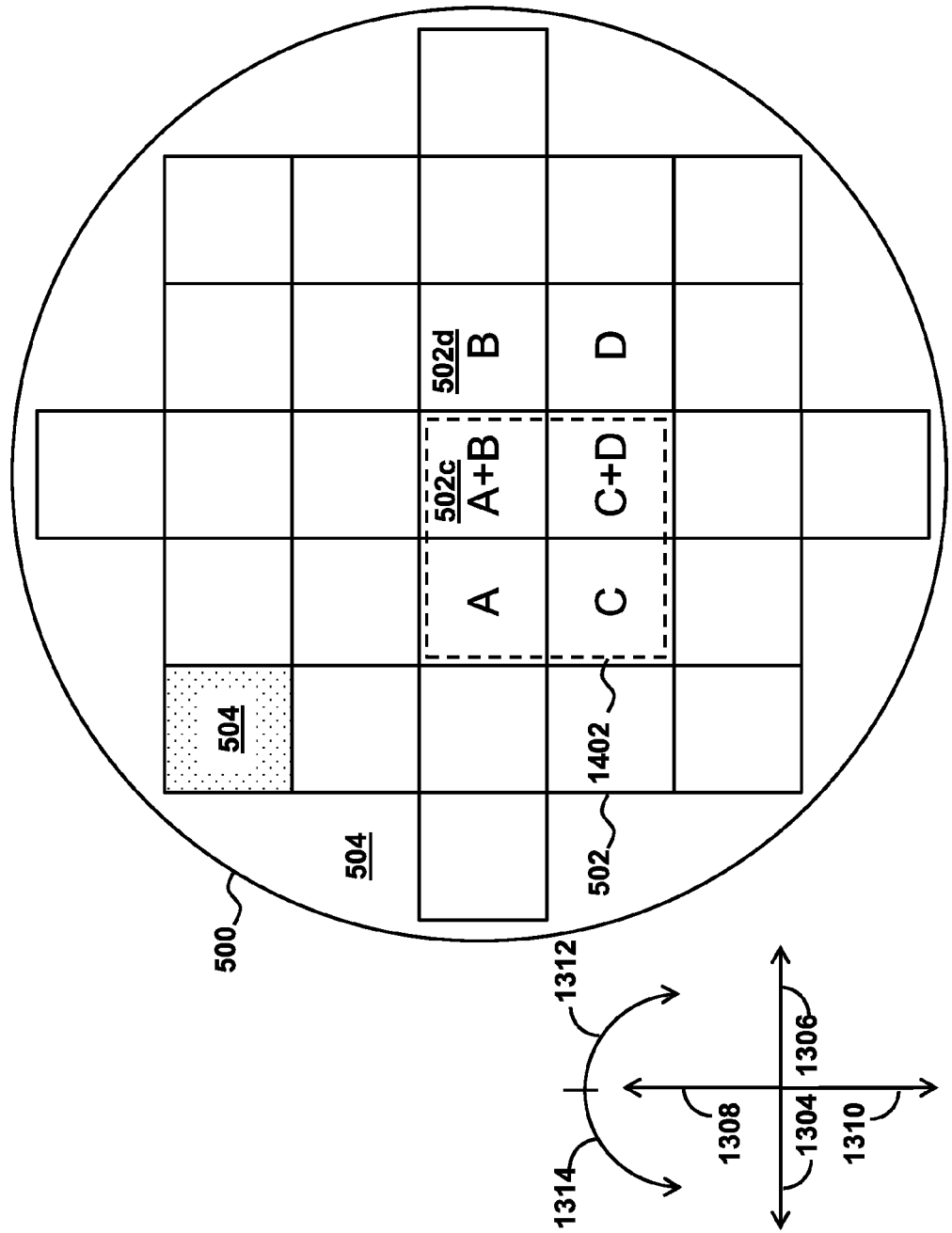

In block 1204, the substrate 500 is aligned for a photolithographic process using the mask 200 in a first orientation. In an embodiment, the first orientation is selected to align a sub-reticle with a region (e.g., region 502c) located near the center of the substrate 500. In FIG. 13, the orientation of the mask 200 relative to the substrate 500 is represented by box 1302. Commonly, the substrate 500 is mounted in a wafer stage of a photolithographic system, while the mask 200 is mounted in a mask stage. Thus, the alignment may be performed by moving the wafer stage, the mask stage, or both. Referring to block 1206 and FIG. 13, four movement directions parallel to the surface plane of the wafer may be defined. For example, directions 1304 and 1306 of FIG. 13 are parallel but opposite. Directions 1308 and 1310 are also parallel but opposite and are perpendicular to directions 1304 and 1306. Two rotational orientations parallel to the surface plane of the wafer may also be defined. Two exemplary orientations are the clockwise orientation 1312 and the counterclockwise orientation 1314 illustrated in FIG. 13. In block 1206, an initial movement direction and rotational orientation are selected. In the illustrated embodiment, the initial movement direction is direction 1304, and the initial orientation is clockwise 1312.

In block 1208, the substrate is exposed in a photolithographic process using the mask in the first orientation. In the exemplary orientation, the photolithographic process exposes region 502c using a first subset of device features. Referring to FIG. 13, individual device features are omitted for clarity. Instead, region 502c is annotated to represent exposure using feature subset A. Likewise, region 502d is annotated to represent exposure using feature set B. Neighboring regions 502 are annotated to represent exposure using feature subsets C and D.

Blocks 1208 and 1210 repeat to step the mask 200 around the substrate 500 in a spiral pattern. This motion may eliminate the inefficiency and inaccuracy of start-of-row alignment in row-and-column stepping techniques. In block 1210, the alignment of the mask 200 and the substrate 500 is adjusted according to the movement direction and orientation in an outward spiral in order to expose each active region 502 of the substrate 500 using each sub-reticle 202 of the mask 200. The alignment is shifted by a partial pitch increment defined by the configuration of sub-reticles. For example, in an embodiment characterized by a mask 200 with four sub-reticles 202 arranged in a 2×2 configuration, the alignment is shifted by a half pitch (approximately the size of the sub-reticle 202 accounting for inter-sub-reticle spacing, inter-regional spacing, alignment, and/or other factors). In a further embodiment characterized by a mask 200 with four sub-reticles arranged in a 1×4 configuration, the alignment is shifted by a quarter pitch in one direction or a full pitch in another direction perpendicular to the first.

To form a spiral pattern, the alignment is shifted in either the current movement direction or a next direction perpendicular to the current movement direction as determined by the orientation. For example, in an embodiment utilizing a clockwise orientation 1312, for a current movement direction of 1304, the next movement direction is direction 1308. In such an embodiment, direction 1306 is the next movement direction of 1308, direction 1310 is the next movement direction of 1306, and direction 1304 is the next movement direction of 1310.

Blocks 1212 through 1216 illustrate an exemplary spiral method. It is understood that the specific exemplary method is not limiting. Any other suitable spiral method may be used. In block 1212, it is determined whether an alignment shift in the next movement direction followed by a subsequent exposure will expose any active area 502 with a sub-reticle 202 of the mask 200 with which the area 502 has already been exposed. If not, in block 1214, the next movement direction becomes the current movement direction. If the next movement direction would expose an active area 502 with a sub-reticle 202 with which it has already been disclosed, the current movement direction is not changed. In block 1216, the alignment is shifted according to the current movement direction.

Figure 15:
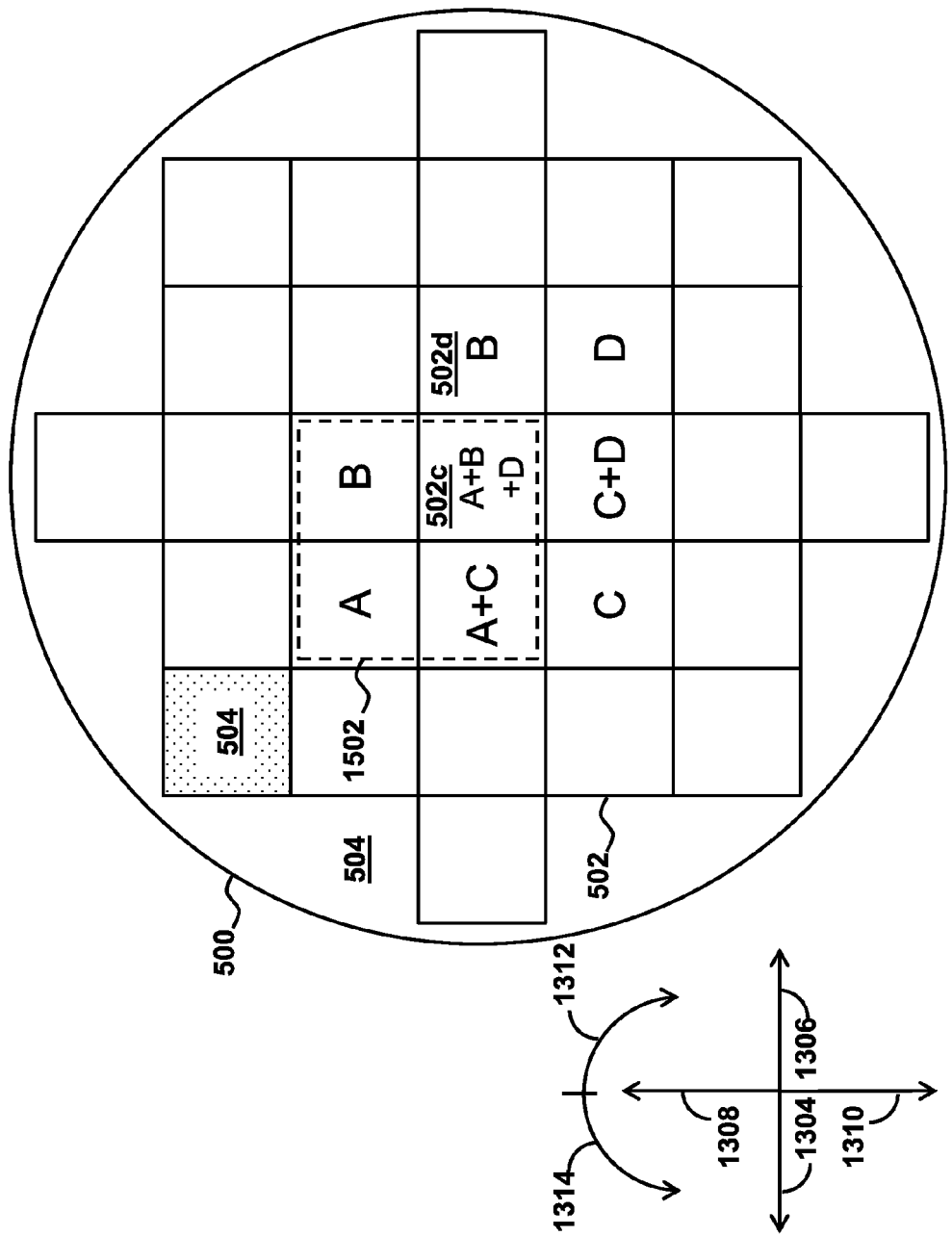

The exemplary spiral algorithm is disclosed with reference to FIGS. 14-19. In the embodiment illustrated in FIG. 14, the reticle position is indicated by box 1402, the current movement direction is direction 1304 and the orientation is clockwise. Therefore, the next movement direction is direction 1308. In block 1212, it is determined that a shift in the next direction (direction 1308) will not expose any active area 502 with a sub-reticle 202 with which it has already been exposed. Therefore, direction 1308 becomes the current movement direction, and the alignment is shifted by a half pitch in direction 1308 as illustrated in FIG. 15 by box 1502.

Referring to FIG. 15, the current movement direction is direction 1308 and the orientation is clockwise. In block 1212, it is again determined that a shift in the next direction (direction 1306) will not expose any active area 502 with a sub-reticle 202 with which it has already been exposed. Therefore, direction 1306 becomes the current movement direction, and the alignment is shifted by a half pitch in direction 1306 as illustrated in FIG. 16 by box 1602.

Figure 16:
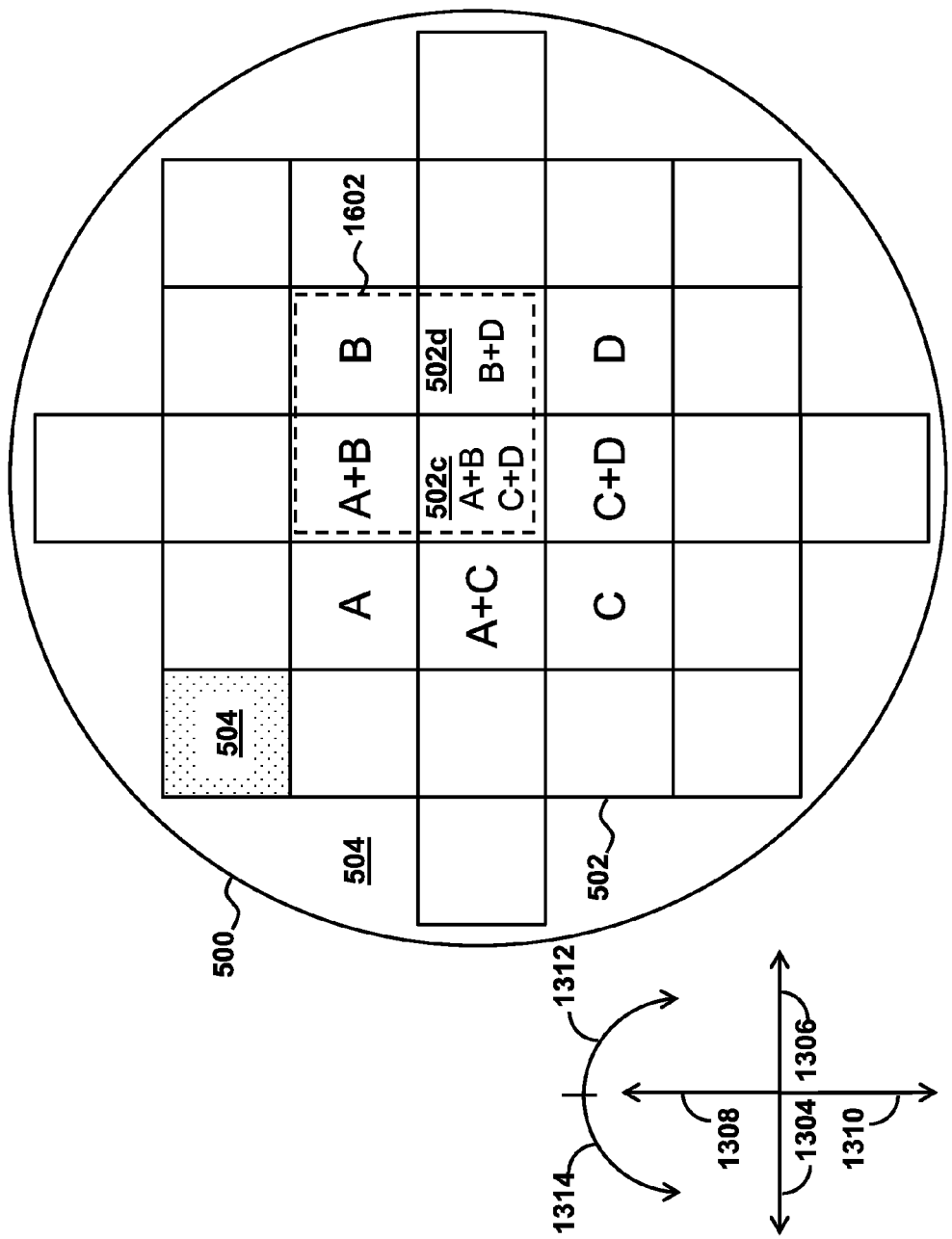

Referring to FIG. 16, the current movement direction is direction 1306 and the orientation is clockwise. In block 1212, it is determined that a shift in the next direction (direction 1310) will perform a repeat exposure. For example, active area 502c will be exposed using pattern A with which it has already been exposed, and active area 502d will be exposed using pattern B with which it has already been exposed. Therefore, the current movement direction remains unchanged, and the alignment is shifted a half pitch in direction 1306 as illustrated in FIG. 17 by box 1702.

Figure 17:
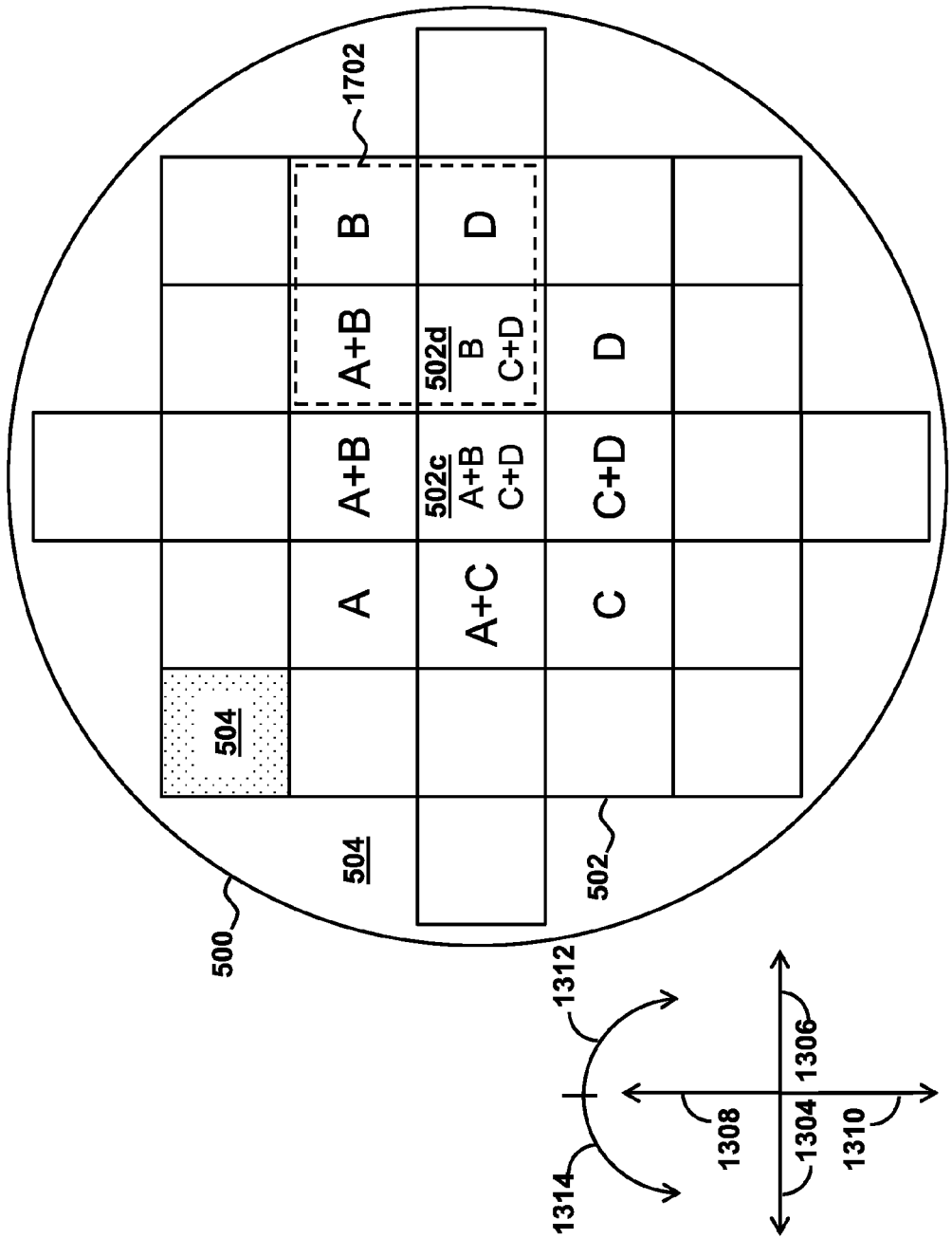

Referring to FIG. 17, the current movement direction is direction 1306 and the orientation is clockwise. In block 1212, it is determined that a shift in the next direction (direction 1310) will not expose any active area 502 with a sub-reticle 202 with which it has already been exposed. Therefore, direction 1310 becomes the current movement direction, and the alignment is shifted one half pitch in direction 1310.

Figure 18:
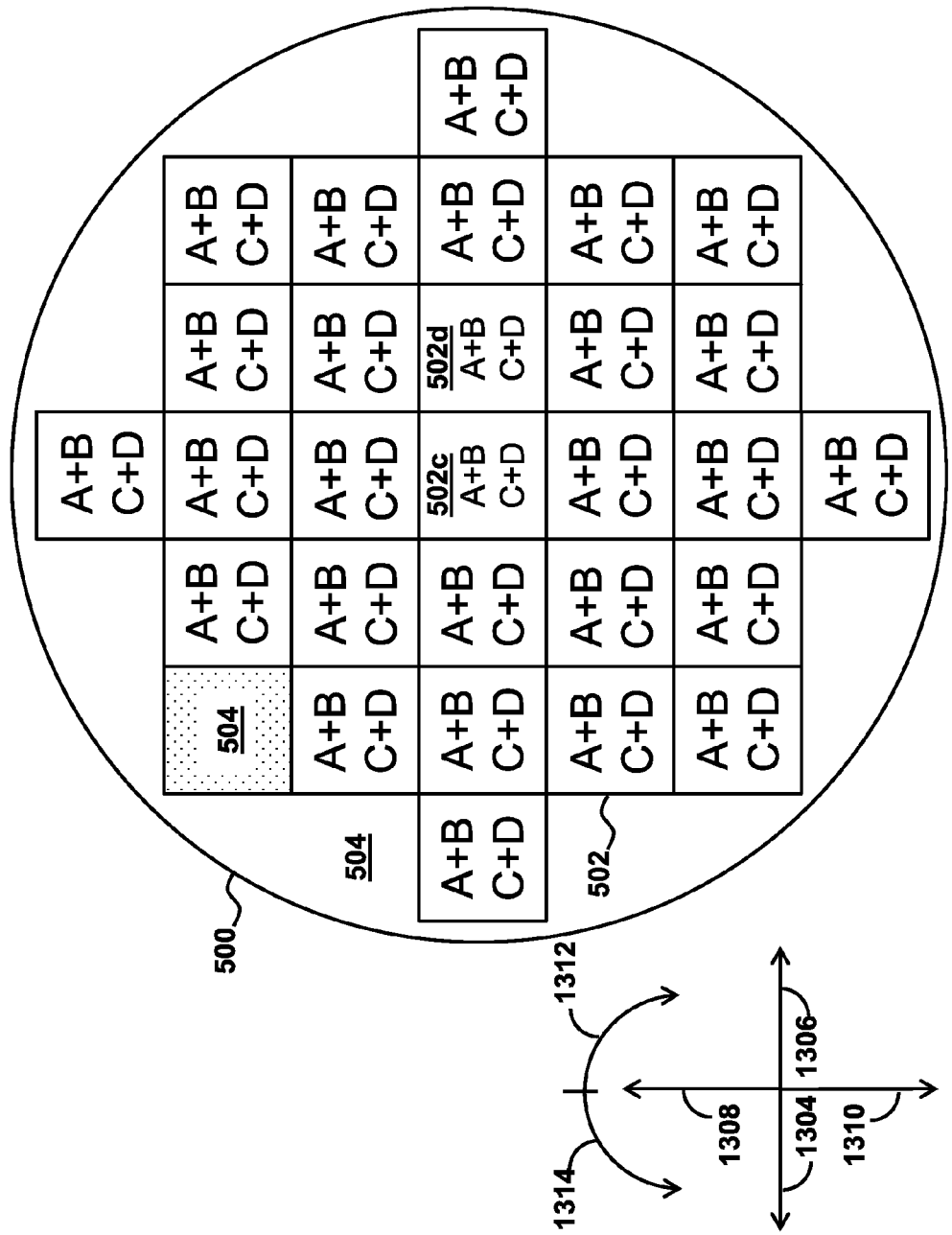

FIG. 18 illustrates the status of the substrate upon completion of photolithography, when each region 502 has been exposed and processed using each subset of features (e.g., feature subsets A, B, C and D). Referring to block 1218 of FIG. 12 and to FIG. 18, when the lithography is complete, the photoresist is developed. This may include performing a post-exposure bake process and developing the resist to form a masking element from a remaining portion of the resist. At this stage, active regions (e.g., active regions 502a and 502b) corresponding to equivalent finished designs may have been exposed using different feature subsets (e.g., feature subsets A and B) corresponding to different sub-reticles 202 of the mask 200. Therefore, in an embodiment, developing forms different masking element features within different regions. In block 1220, the masking element is used in a processing step. Typical processing steps include etching such as dry etching, and wet etching. However, some embodiments incorporate processing steps including deposition, implantation, epitaxy, and other suitable semiconductor manufacturing steps. Following the processing step, the remaining photoresist may be stripped from the substrate 500.

Figure 19:
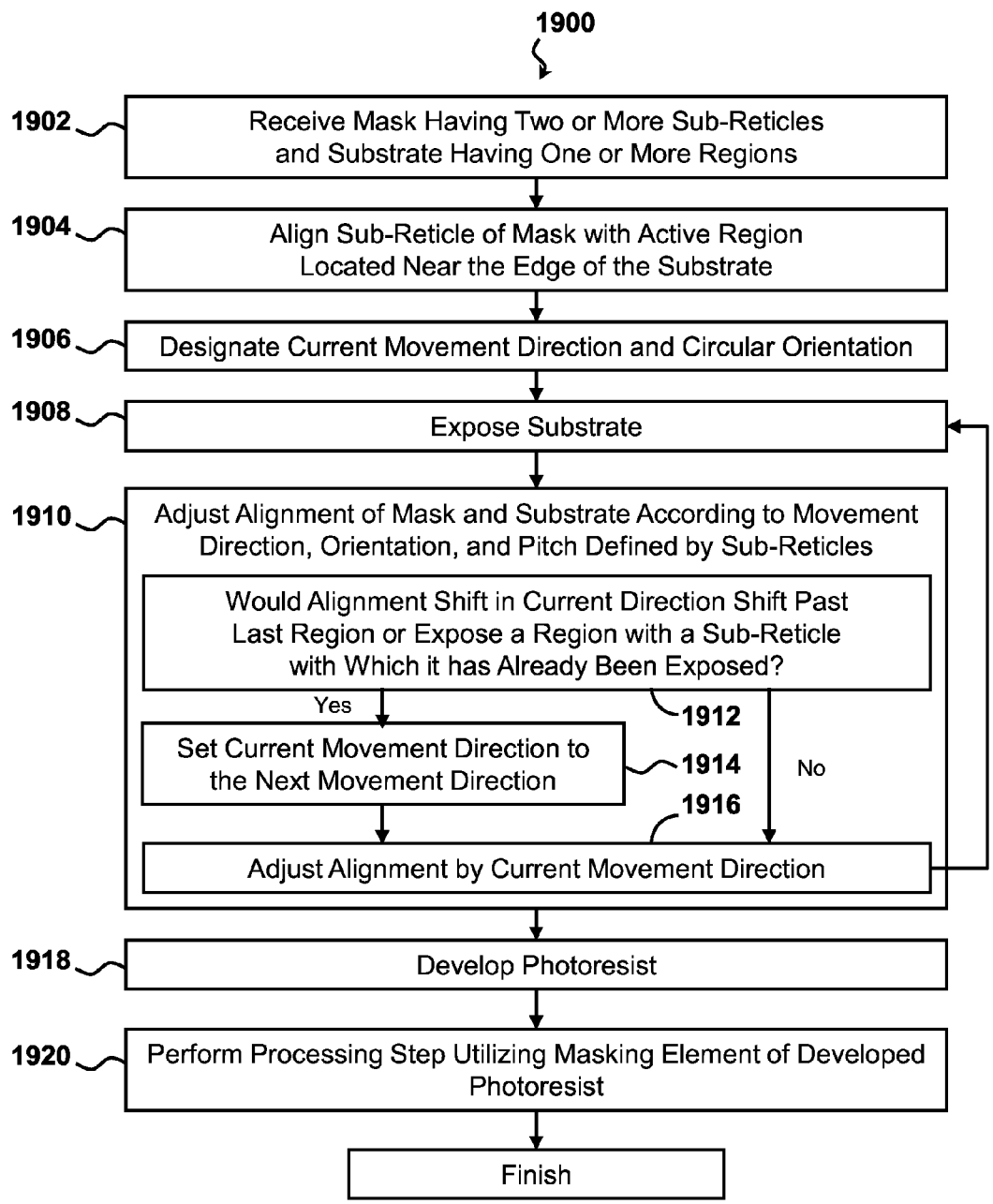
FIG. 19 is a flow diagram of a multiple-patterning single-etching method utilizing an inward spiral pattern according to some embodiments.

FIG. 19 is a flow diagram of a multiple-patterning single-etching method 1900 utilizing an inward spiral pattern according to some embodiments. In many respects, the method 1900 is substantially similar to the method 1200 of FIG. 12. It is understood that additional steps can be provided before, during, and after the method 1900, and some of the steps described can be replaced or eliminated for other embodiments of the method 1900.

The method 1900 begins at block 1902 where a composite mask 200 having two or more sub-reticles 202 is received. A substrate 500 having one or more active device regions 502 (e.g., regions 502c and 502d) is also received. The substrate 500 may be a wafer, a semiconductor substrate, or any base material on which processing is conducted to produce layers of material, pattern features, and/or integrated circuits. In some embodiments, a photoresist layer is applied to the substrate 500. The substrate 500 may also include excluded regions 504 corresponding to areas of the substrate 500 where patterning is either not performed or will not be effective.

In block 1904, the substrate 500 is aligned for a photolithographic process using the mask 200 in a first orientation. In an embodiment, the first orientation is selected to align a sub-reticle with a region located near an edge of the substrate 500. Commonly, the substrate 500 is mounted in a wafer stage of a photolithographic system, while the mask 200 is mounted in a mask stage. Thus, the alignment may be performed by moving the wafer stage, the mask stage, or both. Four movement directions parallel to the surface plane of the wafer may be defined. Two rotational orientations parallel to the surface plane of the wafer may also be defined. In block 1206, an initial movement direction and rotational orientation are selected.

In block 1908, the substrate is exposed in a photolithographic process using the mask in the first orientation. In block 1910, the alignment of the mask 200 and the substrate 500 is adjusted according to the movement direction and orientation in an inward spiral. The alignment is shifted by a partial pitch defined by the configuration of the sub-reticles. For example, in an embodiment characterized by a mask 200 with four sub-reticles 202 arranged in a 2×2 configuration, the alignment is shifted by a half pitch (approximately the size of the sub-reticle 202 accounting for inter-sub-reticle spacing, inter-regional spacing, alignment, and/or other factors). In a further embodiment characterized by a mask 200 with sub-reticles arranged in 4×4 configuration, the alignment is shifted by a quarter pitch.

To form a spiral pattern, the alignment is shifted in either the current movement direction or a next direction perpendicular to the current movement direction as determined by the orientation. Blocks 1912 through 1916 illustrate an exemplary spiral method. It is understood that the specific exemplary method is not limiting. Any other suitable spiral method may be used. In block 1912, it is determined whether an alignment shift in the current direction would shift past the last region in the current direction or, if followed by a subsequent exposure, would expose any region 502 with a sub-reticle 202 of the mask 200 with which the region 502 has already been exposed. If either is so, in block 1914, the current movement direction is set to the next movement direction. If neither is true, the current movement direction is not changed. In block 1916, the alignment is shifted according to the current movement direction.

In block 1918, when the lithography is complete, the photoresist is developed. This may include performing a post-exposure bake process and developing the resist to form a masking element from a remaining portion of the resist. At this stage, active regions (e.g., active regions 502a and 502b) corresponding to equivalent finished designs may have been exposed using different feature subsets (e.g., feature subsets A and B) corresponding to different sub-reticles 202 of the mask 200. Therefore, in an embodiment, developing forms different masking element features within different regions. In block 1920, the masking element is used in a processing step. Typical processing steps include etching such as dry etching, and wet etching. However, some embodiments incorporate processing steps including deposition, implantation, epitaxy, and other suitable semiconductor manufacturing steps. Following the processing step, the remaining photoresist may be stripped from the substrate 500.

Thus, the present invention provides a composite mask suitable for multiple-patterning lithographic processes and provides a multiple-patterning photolithographic process utilizing the mask. In some embodiments, the method of forming a semiconductor device comprises: receiving a mask having a plurality of sub-reticles and a substrate having one or more regions; aligning a first sub-reticle of the plurality of sub-reticles with a first region of the one or more regions; designating a movement pattern relative to a surface plane of the substrate; performing a first photolithographic process including exposing the substrate using the mask to form a first exposed area on the substrate; shifting an alignment of the mask relative to the substrate according to a first direction determined by the movement pattern; and performing a second photolithographic process including exposing the substrate using the mask to form a second exposed area on the substrate, the second exposed area overlapping the first exposed area. In one such embodiment, the movement pattern is a spiral pattern; the designating of the movement pattern further designates a current movement direction and a circular orientation relative to the surface plane of the substrate; and the first direction is determined by the current movement direction and the circular orientation.

In a further embodiment, the method of forming an integrated circuit device comprises: receiving a substrate and a mask having a plurality of sub-reticles; aligning the substrate and the mask; performing a first photolithographic sequence including: performing a first plurality of exposures on the substrate using the mask to form a first plurality of exposed areas of the substrate; and shifting an alignment of the mask relative to the substrate between the first plurality of exposures such that the first plurality of exposed areas do not overlap; thereafter shifting the alignment of the mask relative to the substrate by an intermediate shift increment that includes a partial pitch shift; and performing a second photolithographic sequence including: performing a second plurality of exposures on the substrate using the mask to form a second plurality of exposed areas of the substrate; and shifting the alignment of the mask relative to the substrate between the second plurality of exposures such that the second plurality of exposed areas do not overlap.

In yet another embodiment, the photomask comprises: a mask substrate; and a reticle containing first, second, third, and fourth sub-reticles, wherein the first, second, third, and fourth sub-reticles contain first, second, third, and fourth subsets of device features, respectively; wherein the first, second, third, and fourth subsets of device features are different; and wherein the first, second, third, and fourth sub-reticles correspond to first, second, third, and fourth photolithographic exposures, respectively, of a multiple patterning photolithographic process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    exposing a region of a substrate to radiation in a first lithographic procedure using a mask in a first alignment;
    thereafter realigning the substrate relative to the mask according to a spiral movement pattern into a second alignment; and
    exposing the region of the substrate to radiation in a second lithographic procedure using the mask in the second alignment, wherein at least a portion of the region is exposed to radiation in both the first lithographic procedure and the second lithographic procedure.

2. The method of claim 1, wherein the spiral pattern is configured to spiral outward from a central location of the substrate.

3. The method of claim 1, wherein the spiral pattern is configured to spiral inward from a location on a perimeter of the substrate.

4. The method of claim 1, wherein a first sub-reticle of the mask is used to expose the portion during the first lithographic procedure and a second sub-reticle of the mask is used to expose the portion during the second lithographic procedure, and wherein a pattern of the first sub-reticle is different from a pattern of the second sub-reticle.

5. The method of claim 1, wherein the mask has a reticle defined thereupon, and wherein a portion of the reticle is bladed off during one of the first lithographic procedure and the second lithographic procedure without being bladed off during the other of the first lithographic procedure and the second lithographic procedure.

6. The method of claim 1, wherein an amount by which an alignment of the substrate relative to the mask is adjusted during the realignment is determined by an arrangement of sub-reticles of the mask.

7. The method of claim 1, wherein, during the realigning, an alignment of the substrate relative to the mask is adjusted by a non-zero amount that is less than one pitch.

8. The method of claim 1, wherein, during the realigning, an alignment of the substrate relative to the mask is changed by a first non-zero amount less than one pitch in a first direction, and by a second non-zero amount less than one pitch in a second direction perpendicular to the first direction.

9. A method comprising:
    aligning a lithographic mask with a substrate such that a first region of the substrate will be exposed to radiation according to the lithographic mask during an exposure process;
    exposing the first region of the substrate using the lithographic mask;
    modifying an alignment of the lithographic mask relative to the substrate according to a spiral pattern; and
    thereafter exposing a second region of the substrate using the lithographic mask.

10. The method of claim 9, wherein the first region is at a central location of the substrate, and wherein the spiral pattern is configured to spiral outward.

11. The method of claim 9, wherein the first region is at a perimeter of the substrate, and wherein the spiral pattern is configured to spiral inward.

12. The method of claim 9,
wherein the mask includes a plurality of sub-reticles,
wherein at least one sub-reticle of the plurality of sub-reticles has a pattern different from that of another of the plurality of sub-reticles, and
wherein at least one of the exposing of the first region and the exposing of the second region includes blading off at least one of the plurality of sub-reticles.

13. The method of claim 9, wherein the modifying of the alignment changes the alignment by an amount greater than zero and less than one pitch.

14. The method of claim 9, wherein at least a portion of the first region of the substrate and a second region of the substrate overlap.

15. A lithographic method comprising:
receiving a substrate having a lithographically-sensitive resist disposed thereupon;
performing a sequence of lithographic exposures of the substrate to expose the resist to lithographic radiation, wherein each exposure of the sequence of lithographic exposures exposes a portion of the resist; and
between exposures of the sequence of lithographic exposures, modifying an alignment of the substrate according to a spiral exposure pattern.

16. The lithographic method of claim 15, wherein the spiral exposure pattern is configured such that the sequence of lithographic exposures spirals outward relative to the substrate.

17. The lithographic method of claim 15, wherein the spiral exposure pattern is configured such that the sequence of lithographic exposures spirals inward relative to the substrate.

18. The lithographic method of claim 15, wherein the spiral exposure pattern shifts the alignment of the substrate by a step increment determined by an arrangement of a plurality of sub-reticles upon a mask.

19. The lithographic method of claim 18, wherein the arrangement is a 2×2 configuration.

20. The lithographic method of claim 15, wherein the modifying of the alignment according to the spiral exposure pattern includes determining whether a proposed alignment would result in a portion of the substrate being exposed by a sub-reticle of a mask by which it has already been exposed.

* * * * *